United States Patent [19]
Hattori

[11] Patent Number: 4,646,418
[45] Date of Patent: Mar. 3, 1987

[54] CARRIER FOR PHOTOMASK SUBSTRATE

[75] Inventor: Isao Hattori, Kanagawa, Japan

[73] Assignee: Clean Surface Technology Co., Kanagawa, Japan

[21] Appl. No.: 805,605

[22] Filed: Dec. 6, 1985

[30] Foreign Application Priority Data

Dec. 8, 1984 [JP] Japan .......................... 59-186600[U]
Feb. 27, 1985 [JP] Japan ............................ 60-29150[U]

[51] Int. Cl.$^4$ ............................ B23Q 7/00; B25B 1/00
[52] U.S. Cl. ............................ 29/559; 269/254 CS; 269/279
[58] Field of Search ......................... 29/559, 270, 283; 269/254 CS, 239, 257, 279, 265, 268, 269, 3, 6; 81/64, 65

[56] References Cited

U.S. PATENT DOCUMENTS

| | | | |
|---|---|---|---|
| 600,370 | 3/1898 | Kohler | 269/279 |
| 1,610,387 | 12/1926 | Pennington | 81/64 |
| 2,093,658 | 9/1937 | Hildenbrand | 269/254 |
| 3,084,930 | 4/1963 | Wilcox | 269/257 |
| 3,330,552 | 7/1967 | Bucher | 269/254 CS |
| 3,826,483 | 7/1974 | Siegel | 269/254 CS |
| 3,964,115 | 6/1976 | Platek | 81/64 |
| 4,213,698 | 7/1980 | Firtion et al. | 29/559 |
| 4,253,648 | 3/1981 | Meeks | 269/6 |
| 4,462,153 | 7/1984 | DeBortoli | 269/254 CS |

Primary Examiner—Mark Rosenbaum
Assistant Examiner—Irene Graves Golabi
Attorney, Agent, or Firm—Wenderoth, Lind & Ponack

[57] ABSTRACT

A carrier for a flat photomask substrate having peripheral edges comprises a frame, a handle, a shaft, primary rings, and a spring. The frame has two ends, a periphery, and a shape with one side open. The handle has two ends and is journaled to one of the two ends of the frame. The shaft is provided through the one end of the frame and one end of the handle. This shaft allows the one end of the frame to pivot in a freely rotatable manner about the one end of the handle. The primary rings are arranged at the other end of the frame and at the one end of the handle. Such primary rings support the peripheral edges of the flat photomask substrate. The spring extends between the one end of the frame and the one end of the handle. This spring presses the primary rings into contact with the peripheral edges of the flat photomask substrate. The carrier also comprises auxiliary rings, recesses formed in each of the primary and auxiliary rings, grooves formed in each of the primary and auxiliary rings, a projection located where the handle is journaled to the frame, and a trigger mounted on the projection for releasing the primary rings.

8 Claims, 7 Drawing Figures

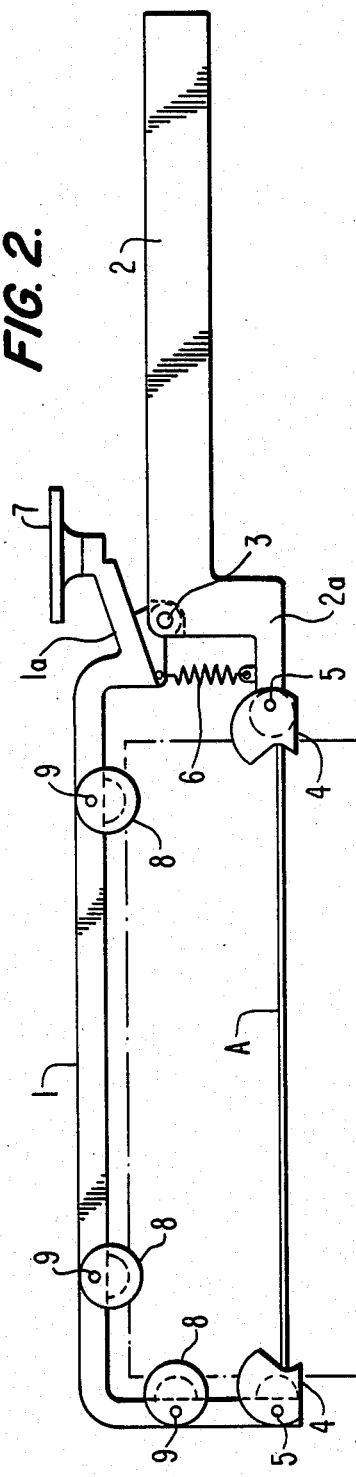
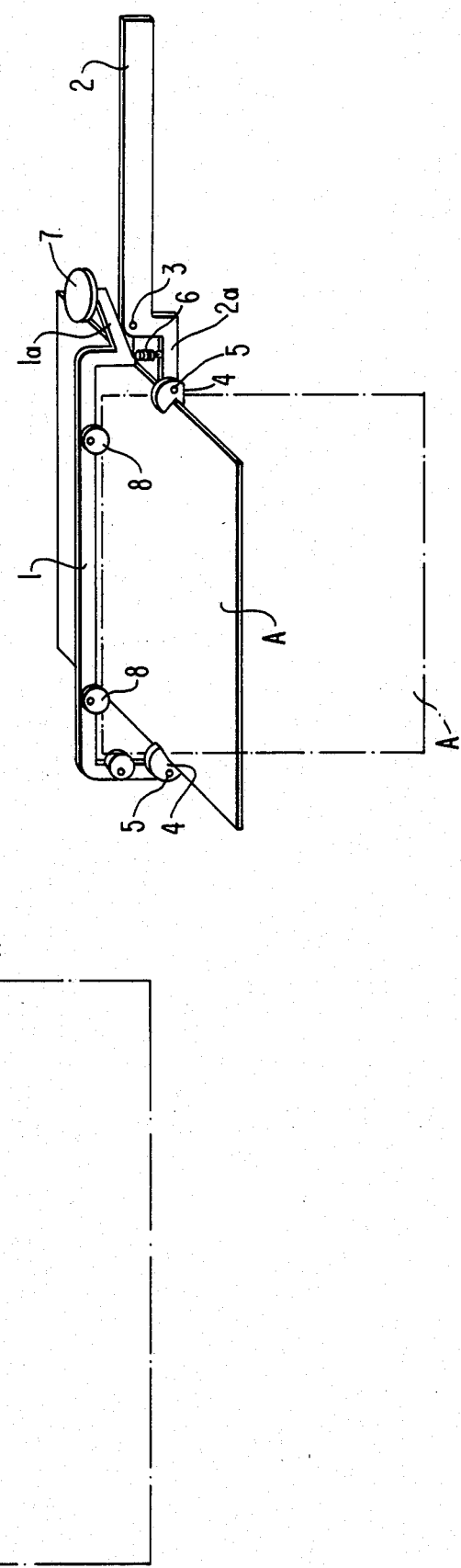

CARRIER FOR PHOTOMASK SUBSTRATE

BACKGROUND OF THE INVENTION

1. Field of the Invention

The present invention relates to a carrier for a photomask substrate or a silicon wafer employed in manufacturing semiconductor components such as IC, LSI, etc.

2. Description of the Prior Art

A photomask substrate or a silicon wafer is subjected to fine photoetching and contact with operators should be avoided as much as possible. Particular attention is paid when transporting or storing these substrates. Operators try to hold the edges of a substrate to avoid physical contact with its surface.

A photomask substrate of the prior art is 76 to 127 millimeters (mm) square so that it could be transported by holding its edges as described above, requiring no jigs or tools especially designed for the purpose of transportation.

In view of the prior art, the present inventor proposed an invention disclosed in Japanese Utility Model Application No. 59-186600. This invention proposed a carrier comprising a frame in a semi-circular shape or a square having one open side, a handle journaled on the frame in a freely rotatable manner, and supporting rings attached on a frame end and on the inside of the handle so that, when a photomask substrate is held on the peripheral edges thereof with the two supporting rings, the substrate may be held with the rotating force generated downwardly on the ends of the frame.

No transporting jig was required so long as the substrate was small enough to be held at the periphery thereof with only one hand. However, when the substrate becomes as large as 150 to 250 mm square or a disc of 150 to 250 mm diameter, it is difficult to hold it by the edge thereof with only one hand. If both hands are used, the handling of the substrate tends to become unsteady, causing operators to drop it or to touch the surface thereof.

It is difficult to hold a silicon wafer at a single point, for example, by a pair of tweezers. Even if it may be retained, internal distortion due to the weight of the wafer itself often arises and results in a bent or otherwise defective product.

In the above-mentioned device proposed by the present inventor, as the weight of the frame was used to support the substrate, the carrier could effectively transport the substrate which was placed vertically. However, the invention was detrimental in that it was difficult to take out or transport the substrate which was placed horizontally.

The present invention aims to provide a carrier jig which enables operators to transport a photomask substrate or a silicon wafer without touching the surface thereof with fingers and which enables them to take out or transport the substrate whether it is placed vertically or horizontally. The present invention also aims at providing a transporting jig which allows manual operation when a handle is attached, and which also allows the handle thereof to be attached to an industrial robot without any modification.

SUMMARY OF THE INVENTION

The present invention has been developed to solve the above problems. An object of this invention is to provide a carrier which is characterized in that a handle is journaled in a freely rotatable manner to the base of a frame in a semi-circular shape or in a rectangular shape having one side open. Supporting rings provided with engaging grooves both in vertical and horizontal directions are attached on one end of the frame and the inside of the handle, and the end of the frame and the handle are energized to approach each other.

A substrate is vertically or horizontally retained when the periphery of a photomask substrate is abutted against the handle and the supporting rings of the frame. The substrate is firmly retained by an energizing device which is provided between the frame and the handle.

The present invention is characterized in that a frame is provided freely rotatably against the handle. Supporting rings with engaging grooves in both vertical and horizontal directions are attached to the tip of the frame and the inside of the handle. It is, therefore, effective in holding and transporting a photomask substrate in either vertical or horizontal directions.

It is also possible to attach the present inventive carrier without any modification to an automatic conveyor, such as an industrial robot. In such a case, the handle of the carrier is attached to the transporting machine.

BRIEF DESCRIPTION OF THE DRAWINGS

FIG. 1 is a perspective view of a first embodiment of the present invention when assembled.

FIG. 2, is a front view thereof.

FIG. 3 shows a supporting ring, of which

FIG. 4 shows an auxiliary supporting ring, of which

DETAILED DESCRIPTION OF THE PREFERRED EMBODIMENTS

FIG. 1 shows a carrier jig for transporting a square-shaped photomask substrate A. A frame 1 is made of metal and has a rectangular shape with one side open when viewed from the front. The open side is placed downward and a handle 2 is connected to one of the frame ends with a shaft in a freely rotatable manner. Supporting rings are attached with pins 5 to the tip of the frame 1 and to a projection 2a inside the handle 2 which is opposed to an end tip of the frame 1.

Figure 3A:
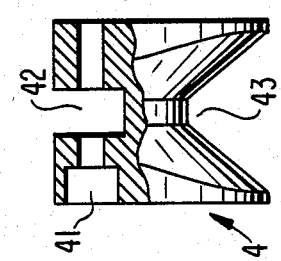
FIG. 3(A) is a front view and FIG. 3(B) is a partially exploded side view.

Referring to FIGS. 3(A) and (B), a supporting ring 4 made of plastic, such as Teflon, is provided with a hole 41 at the upper front portion thereof to which the pin 5 shown in FIGS. 1 and 2 is inserted. An upper groove 42 is formed at a position perpendicular to the hole 41 into which the frame 1 is inserted. A bottom groove 43 is cut below the shaft hole 41 and is tapered toward the top. The supporting ring 4 is further provided with a front groove 44 farther down the bottom groove 43 when the hole 41 is viewed from the front. A cut-out portion 45 is provided in the supporting ring 4 at the side of the front groove 44.

Figure 3B:
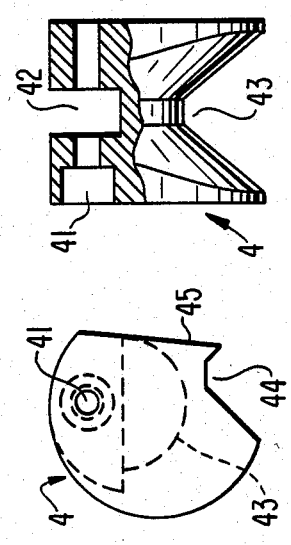

As shown in FIG. 2, the supporting rings 4 are secured with the pins 5 by inserting the frame 1 or the handle 2 into the upper groove 42 shown in FIG. 3(B). The supporting rings 4 must be attached in such a manner that the front engaging grooves 44 of FIG. 3(A) face each other both at the frame 1 and the handle 2 of FIG. 2. The photomask substrate A of FIG. 2 is supported by the bottom groove 43 of FIG. 3(B) when vertically held and by the front groove 44 of FIG. 3(A) when horizontally held.

As shown in FIG. 2 at a location near the point where the frame 1 and handle 2 are journaled by a shaft 3, there is provided a spring 6 which energizes the supporting rings 4 on the handle 2 and on the frame 1 to move each other. The frame 1 is provided with a projection 1a on the outside thereof which projects from the portion attaching the handle 2 with the shaft 3 toward the handle 2. A pressing metal trigger 7 is fitted to the projection 1a.

Figure 4A:
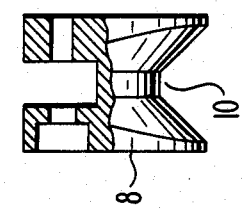
FIG. 4(A) is a front view and FIG. 4(B) is a partially exploded side view.
Figure 4B:
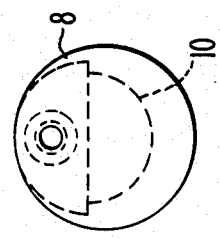

The frame 1 is further provided with auxiliary supporting rings 8 secured by pins 9 between the shaft 3 and the supporting ring 4 on the end tip of the frame 1 at appropriate intervals. Referring to FIGS. 4(A) and (B), an auxiliary supporting ring 8 is used only when the substrate A of FIGS. 1 and 2 is held vertically so that a bottom member 10 which is tapered toward the top suffices.

The photomask substrate A of FIGS. 1 and 2 is generally stored in a case, etc. In order to transport the substrate A horizontally to another place one by one, an operator holds the handle 2, revolves the frame 1 about the shaft 3 by releasing the trigger 7 so that the supporting rings 4 at the end tip of the frame 1 swings into contact with and abut against the peripheral edges of the substrate A to be transported. When transporting the substrate A vertically, the peripheral edges of the substrate A are locked with the bottom engaging grooves 43 shown in FIGS. 3(A) and 3(B) of the supporting rings 4 whereas the peripheral edges of the substrate A are locked with the front groove 44 of FIG. 3(A) when transporting the substrate A horizontally. See FIG. 2, in particular. Thus, the substrate A is transported to a desired position securely, without being dropped, by the pressure of the supporting rings 4 caused by the spring 6 acting on the frame 1 to hold the substrate A.

Fitting means to be attached to the handle 2 is not shown in the drawings. A means which is easy to grip may usually be attached to the handle 2 for this purpose.

Figure 5:
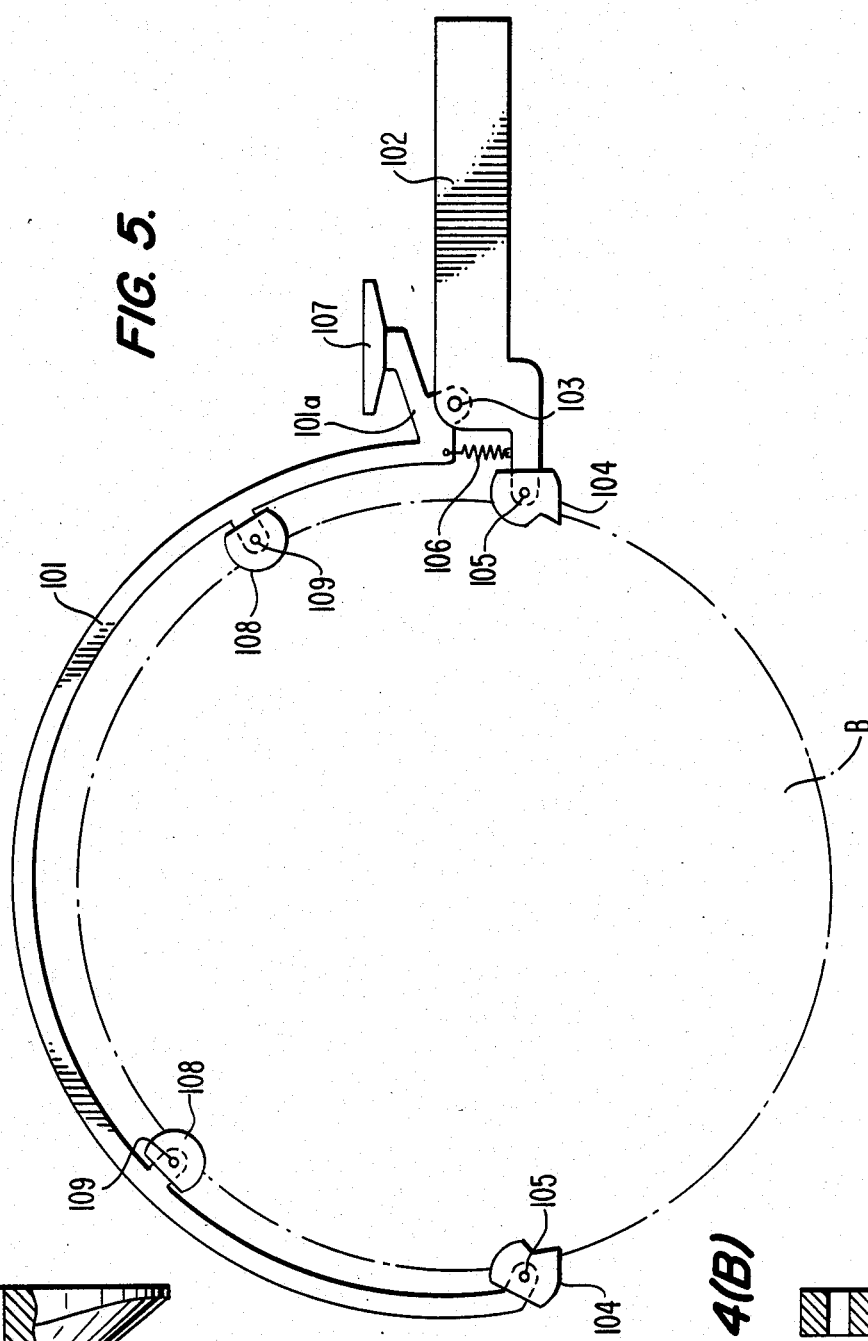
FIG. 5 is a front view of a second embodiment.

FIG. 5 shows another embodiment of the present invention which is a jig to transport a circular substrate B. A frame 101 with a semicircular front is connected with a handle 102 and swings about a shaft 103 in a freely rotatable manner. A plurality of supporting rings 104 and 108 has the same structure as those supporting rings 4 and 8 described in the above embodiment. The supporting rings 104 and 108 are attached with pins 105 and 109 to the insides of the frame 101 and the handle 102. A supporting ring 104 provided at the end tip of the frame 101, especially, is fitted at a position lower than the center of the semi-circle defined by the frame 101 when the handle 102 is oriented in the horizontal direction. A coil spring 106 is provided between the frame 101 and the handle 102 to urge the supporting rings 104 inwardly against the peripheral edges of the circular substrate B.

A pressing trigger 107 is provided on a projection 101a near the position where the frame 101 is journaled to revolve the frame 101 about the shaft 103.

A coil spring 106 is provided between the frame 101 and the handle 102 to press the two elements toward each other when the trigger 107 is released. The coil spring 106 works in such a direction as to press the supporting rings 104 and 108 onto the peripheral edges of the circular substrate B when retaining it in position.

I claim:

1. A carrier for a flat photomask substrate having peripheral edges, comprising:
   a frame having two ends, a periphery, and a shape with one side open;
   a handle having two ends and being journaled to one of the two ends of the frame;
   a shaft means, provided through one end of the frame and one end of the handle, for allowing the one end of the frame to pivot in a freely rotatable manner about the one end of the handle;
   primary ring means, arranged at the other end of the frame and at the one end of the handle, for supporting the periphery edges of the flat photomask substrate; and
   spring means, extended between the one end of the frame and the one end of the handle, for pressing the primary supporting ring means into contact with the periphery edges of the flat photomask substrate.

2. The carrier according to claim 1, further comprising:
   auxiliary ring means, spaced along and connected at the periphery of the frame, for aiding the primary ring means in supporting the peripheral edges of the flat photomask substrate.

3. The carrier according to claim 2, further comprising:
   recess means, formed in each of the primary and auxiliary ring means, for retaining the peripheral edges of the flat photomask substrate therein.

4. The carrier according to claim 2, further comprising:
   groove means, formed in each of the primary and auxiliary ring means, for engaging the peripheral edges of the flat photomask substrate.

5. The carrier according to claim 4, further comprising:
   trigger means, mounted on the projection, for releasing the primary ring means on the frame from supporting the peripheral edges of the flat photomask substrate upon application of pressure to the trigger means by an operator.

6. The carrier according to claim 1, further comprising:
   a projection formed on the one end of the frame toward the outside at a location where the handle is journaled to the frame.

7. The carrier according to claim 1, wherein:
   said shape of the frame is rectangular.

8. The carrier according to claim 1, wherein:
   said shape of the frame is semi-circular.

* * * * *